United States Patent [19]
Kondow et al.

[11] Patent Number: 5,912,913
[45] Date of Patent: Jun. 15, 1999

[54] VERTICAL CAVITY SURFACE EMITTING LASER, OPTICAL TRANSMITTER-RECEIVER MODULE USING THE LASER, AND PARALLEL PROCESSING SYSTEM USING THE LASER

[75] Inventors: Masahiko Kondow, Kodaira; Kazunori Shinoda, Shiki; Kazuhisa Uomi, Hachioji; Shinji Nishimura, Kodaira, all of Japan

[73] Assignee: Hitachi, Ltd., Tokyo, Japan

[21] Appl. No.: 08/769,789

[22] Filed: Dec. 19, 1996

[30] Foreign Application Priority Data

Dec. 27, 1995 [JP] Japan .................... 7-340520

[51] Int. Cl.⁶ ........................................ H01S 3/19
[52] U.S. Cl. .................. 372/45; 372/46; 372/50; 372/96
[58] Field of Search .................. 372/45, 92, 96, 372/99, 46, 50

[56] References Cited

U.S. PATENT DOCUMENTS 5,363,393  11/1994  Uomi et al. ................. 372/45
5,633,886  5/1997  Ramdani et al. ............ 372/45

FOREIGN PATENT DOCUMENTS

| 5-145170 | 6/1993 | Japan . |
| 5-283791 | 10/1993 | Japan . |
| 6-132605 | 5/1994 | Japan . |
| 7-154023 | 6/1995 | Japan . |
| 7-162097 | 6/1995 | Japan . |
| 7-297476 | 11/1995 | Japan . |
| 8-195522 | 7/1996 | Japan . |

*Primary Examiner*—James W. Davie
*Attorney, Agent, or Firm*—Antonelli, Terry, Stout & Kraus, LLP

[57] ABSTRACT

Disclosed is a vertical cavity surface emitting laser providing mirrors at least one of which has a high reflectivity to be obtained with a small number of pairs each comprising a semiconductor low-refractivity layer and a semiconductor high-refractivity layer, (1) in which GaAs is used for a substrate and Al, In and P are used as main elements for making the low-refractivity layers lattice-matching the GaAs substrate; (2) in which Ga, In, N and As are used as main elements of the high-refractivity layers; (3) in which GaAs is used for a substrate, Ga, In, N and As are used as main elements for making an active layer and the mirrors lattice-match the GaAs substrate.

35 Claims, 7 Drawing Sheets

VERTICAL CAVITY SURFACE EMITTING LASER, OPTICAL TRANSMITTER-RECEIVER MODULE USING THE LASER, AND PARALLEL PROCESSING SYSTEM USING THE LASER

BACKGROUND OF THE INVENTION

The present invention relates to a semiconductor laser of the surface emitting type and, in particular, relates to a vertical cavity surface emitting laser (VCSEL) that is appropriately applicable to general use such as consumer applications.

Since a vertical cavity surface emitting laser emits a laser beam from the surface of its substrate in a direction perpendicular to the surface, two-dimensional parallel integration is possible. In addition, since the divergence of the beam is relatively narrow, having an angle of the order of 10 degrees, the vertical cavity surface emitting laser is characterized in that coupling with an optical fiber can be implemented with ease and the device can be inspected easily. For this reason, the vertical cavity surface emitting laser is developed aggressively as a device appropriate for creating an optical transmitter-receiver module (an optical interconnection module) of the parallel communication type. Thus far, application targets of the optical interconnection module have included parallel connection between circuit boards and between boxes of equipment such as computers and short-distance communication through an optical fiber. It is expected, applications of the optical interconnection module in the future will include a large-scale computer network and a telecommunication network.

In general, the vertical cavity surface emitting laser has a configuration of a cavity comprising an active layer made of GaAs and GaInAs sandwiched by a mirror above the active layer and an underlayer mirror on the substrate side beneath the active layer. In comparison with an edge emitter semiconductor laser, the length of the cavity is extremely short. It is thus necessary to make laser oscillation easy to generate by setting the reflectivity of each of the mirrors at a very high value of equal to or greater than 99%. For this reason, a distributed Bragg reflector (DBR) is normally used as a mirror. The distributed Bragg reflector is created from layers of low-refractivity materials made of a AlAs and layers of high-refractivity materials made of GaAs. The low-refractivity and high-refractivity materials are stacked on each other alternately with a period of ¼ of the wavelength.

Since the reflectivity can be increased by increasing the number of pairs in the distributed Bragg reflector, in many cases, 30 to 40 pairs are used. If a large number of pairs are used in the distributed Bragg reflector as such, however, it becomes difficult to manufacture the distributed Bragg reflector and, moreover, the yield of the device deteriorates. In addition, a series resistance increases, giving rise to a problem that the power consumption also increases as well. The height of the vertical cavity surface emitting laser also increases. As a result, electrical wiring becomes difficult to implement, making it hard to integrate the vertical cavity surface emitting laser with another semiconductor device such as a transistor for driving the laser. Because of such problems, it is desirable to reduce the number of pairs in the distributed Bragg reflector to as small a value as possible. The number of pairs in the distributed Bragg reflector can be reduced by increasing the difference in refractivity between the low-refractivity layer and the high-refractivity layer.

It is thus important to select a material with a great refractivity difference. From a standpoint of suppressing dislocation generation, however, it is necessary to select a material which exhibits a property of lattice-matching the substrate. At the present time, there are only few materials that satisfy the requirements in both the aspects. For example, the GaAs substrate is a substrate material which allows a crystal having good characteristics to be obtained with ease and, in addition, a semiconductor laser created on such a substrate exhibits a stable temperature characteristic. Therefore, the GaAs substrate is widely used in general applications. At the present time, however, materials which exhibit a lattice-matching property are AlAs and GaAs, materials having a low refractivity and a high refractivity, respectively.

Recently, however, an invention has been disclosed in Japanese Patent Laid-open (Kokai) No. Hei 6-132605. A lattice-mismatch problem is relieved by providing a buffer layer between the substrate and the mirror in a vertical cavity surface emitting layer using lattice-mismatched semiconductor materials. In this example, AlInP is used as a low-refractivity material whereas InGaAsP is used as a high-refractivity material. Both the materials do not exhibit a property of lattice-matching the substrate. However, both the refractivity materials have a fixed thickness equal to one-fourth of the wavelength, a thickness which is much greater than a critical layer thickness of about 10 nm. As a result, effects of lattice mismatching can not be avoided, giving rise to a problem that crystal defects are generated easily.

The number of problems having to do with the number of pairs is particularly high for laser wavelengths in the 1.3 $\mu$m and the 1.55 $\mu$m ranges. InP is mainly used as a substrate and InGaAsP is used as an active layer in the case of a laser with a long wavelength in such ranges. InP used as a substrate has a large lattice constant and a large refractivity difference can not be obtained in the reflector material in order to lattice-match the substrate. It is thus necessary to increase the number of pairs to 40 or even greater. On the other hand, the semiconductor laser created on the InP substrate has another problem that the characteristics thereof greatly change with temperature. For this reason, it is necessary to use the semiconductor laser by adding a device for stabilizing the temperature, giving rise to difficulties in providing the semiconductor laser for general use such as consumer applications. The problem relating to the number of pairs and the temperature-characteristic problem described above make it difficult to put the long-wavelength vertical cavity surface emitting laser to practical use.

SUMMARY OF THE INVENTION

It is an object of the present invention to provide a new vertical cavity surface emitting laser having mirrors which each allow a high reflectivity with a low number of stacked pairs of layers of low-refractivity and high-refractivity materials in order to solve problems encountered in the conventional technologies.

Figure 1A:
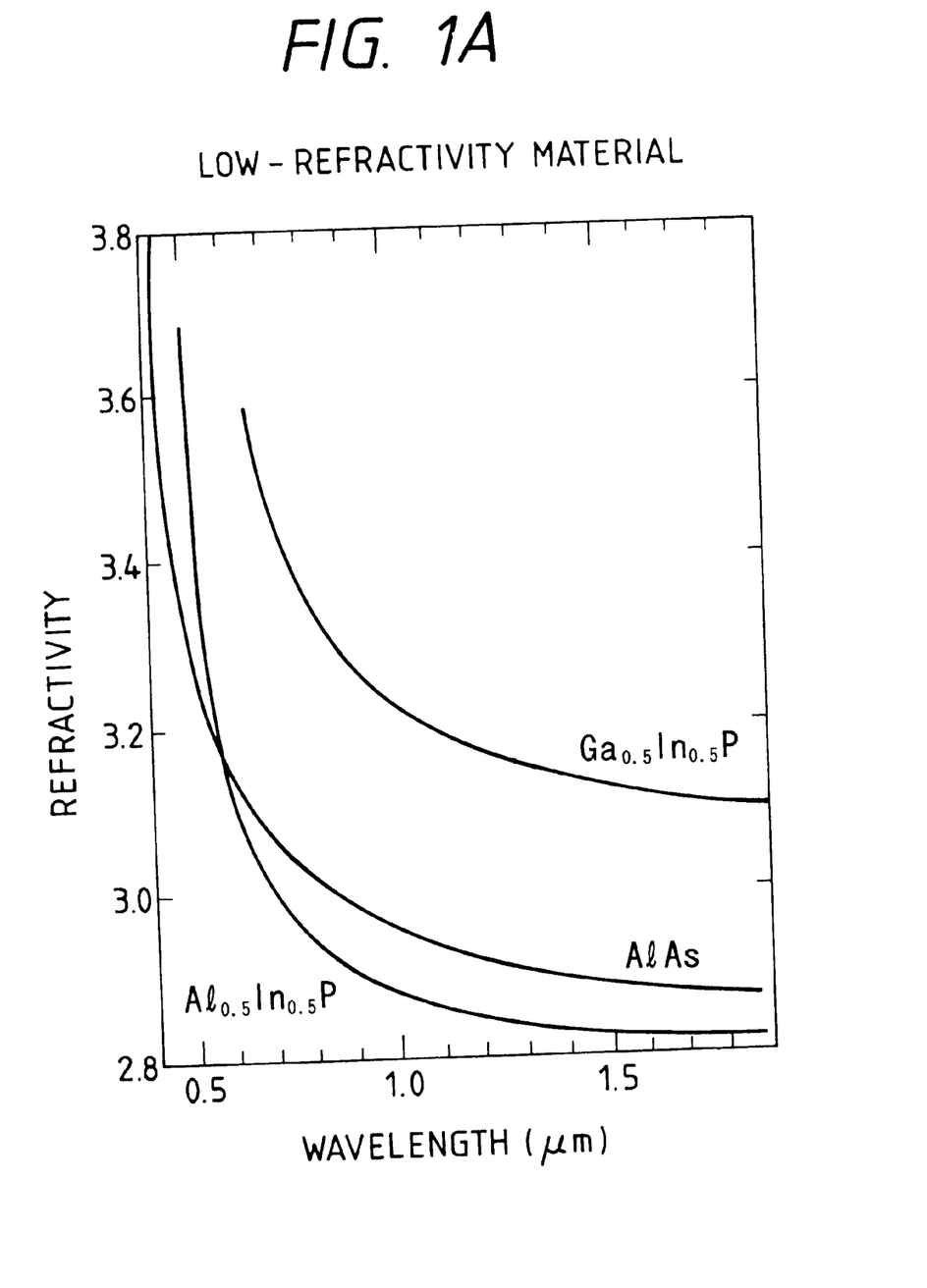
FIG. 1A is an explanatory diagram showing curves representing refractivity characteristics of low-refractivity materials.

It is possible to make AlInP lattice-match a GaAs substrate by adjusting the content ratio of In in AlInP. As a result of examining the refractivity of AlInP in such a state by a characteristic analysis, it has been discovered that a refractivity lower than that of the conventional material can be obtained. Results of the examination are shown in FIG. 1A.

The present invention is based on results of such a research. The greatest characterizing features of the present invention are the use of a GaAs substrate and the use of a semiconductor layer made of AlInP which lattice-matches the GaAs substrate as a low-refractivity layer of at least one of the upper and lower mirrors. It should be noted that the high-refractivity layer is also a semiconductor layer which lattice-matches the GaAs substrate. As a result, a refractivity difference greater than that of the conventional vertical cavity surface emitting laser can be obtained. This great refractivity difference allows a distributed Bragg reflector with a high reflectivity to be implemented with a small number of pairs. It is needless to say that, by using semiconductor layers that lattice-match the substrate as described above in the lower mirrors, it is possible to avoid dislocation generation. Even in the case of the same semiconductor layer used in the upper mirror, since a relation with respect to the property of lattice-matching the substrate is established for an active layer and a cladding layer between the substrate and the upper mirror, the effect of dislocation-generation avoidance can be realized. It should be noted that, within a range in which the refractivity does not change much, another element can be alloyed in the AlInP material.

Figure 1B:
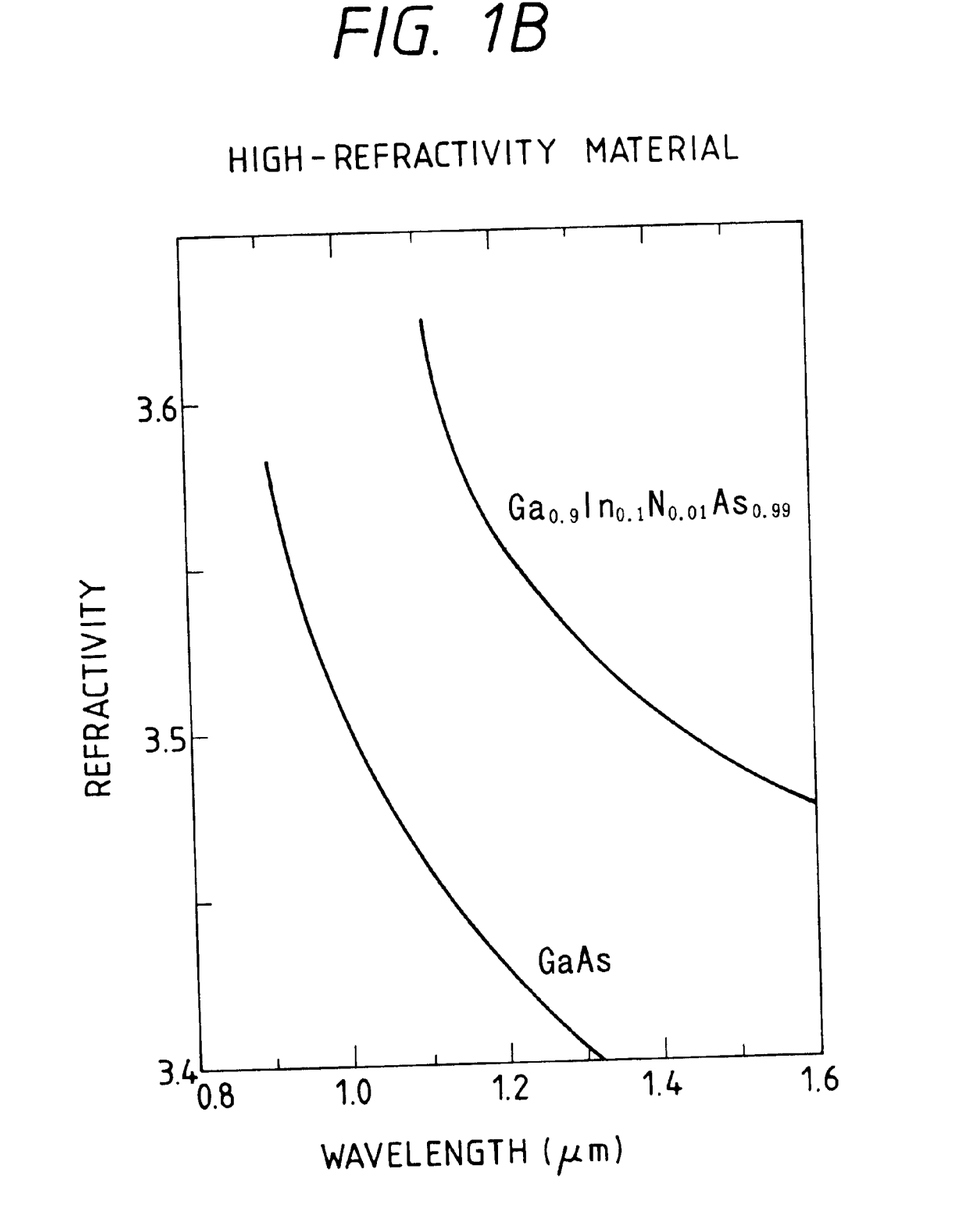
FIG. 1B is an explanatory diagram showing curves representing refractivity characteristics of high-refractivity materials.

As a result of examination of the refractivity of each material in the III-V group by a characteristic analysis by focusing on the fact that nitrogen contributes to a change in refractivity of each material in the III-V group, it has been discovered that GaInNAs is a material having a refractivity higher than the conventional materials. Results of the examination are shown in FIG. 1B.

Another characterizing feature of the present invention is based on results of such a research. Another characterizing feature of the present invention is the use of a semiconductor layer made of GaInNAs which lattice-matches the GaAs substrate as a high-refractivity layer of at least one of the upper and lower mirrors. As a result, a refractivity difference greater than that of the conventional vertical cavity surface emitting laser can be obtained. This great refractivity difference allows a distributed Bragg reflector with a high reflectivity to be implemented with a small number of pairs. It should be noted that, within a range in which the refractivity does not change much, another element can be alloyed in the GaInNAs material.

As is obvious from the results described above, it is needless to say that, by using semiconductor layers made of AlInP and GaInNAs as low-refractivity and high-refractivity layers of the mirror, respectively, an even greater refractivity difference can be obtained.

In addition, by increasing the content ratio of N in GaInNAs, a series resistance of the distributed Bragg reflector of the P-semiconductor can be reduced. It should be noted that, in a vertical cavity surface emitting laser, the resistance of the P-semiconductor with a large effective mass is a problem. The series resistance decreases with a decrease in band-discontinuity of a valence band. When the content ratio of N is increased, the energy at the top of the valence band is decreased so that the band-discontinuity of the valence band on a hetero-interface between a high-refractivity layer and a low-refractivity layer is reduced. To put it concretely, the band-discontinuity of the valence band in a distributed Bragg reflector of the AlAs/GaAs-group semiconductor is of the order of 600 meV. On the other hand, by setting the content ratio of N at a predetermined value, the band-discontinuity of the valence band in a distributed Bragg reflector of the AlInP/GaInNAs-group semiconductor can be reduced to a value of the order of 400 meV. Since the series resistance is an exponential function of the magnitude of the band-discontinuity of the valence band, the series resistance can be reduced to about ⅕. As a result, in a distributed Bragg reflector of the P-semiconductor, the number of pairs can be reduced and, at the same time, the series resistance can be decreased substantially.

With GaInNAs used as a material of the active layer, a bandgap is reduced from 1.4 eV toward 0 eV as the content ratio of N is raised, making it possible to use GaInNAs as a material which emits light with a wavelength greater than 0.85 µm. On the top of that, since GaInNas can lattice-match the GaAs substrate, GaInNAs is an ideal material for a long-wavelength vertical cavity surface emitting laser in the 1.3 µm and 1.55 µm ranges. It stands to reason that inventions have been disclosed in Japanese Patent Laid-open (Kokai) Nos. Hei 7-154023, Hei 7-162097, Hei 8-195522 with regard to a edge emitting laser wherein combinations of GaInNAs and a GaAs substrate are adopted. However, none of those disclosures describes a vertical cavity surface emitting laser.

On the other hand, Japanese Patent Laid-open (Kokai) No. Hei 7-297476 discloses a vertical cavity surface emitting semiconductor laser with the active layer of InGaN. In this Gazette, a semiconductor laser having a Bragg reflector formed of GaN-layers and InAlN-layers laminated (stacked) alternately is disclosed. But as the FIG. 3 thereof shows, each semiconductor crystal of InGaN, GaN, and InAlN in this Gazette has wurtzite structure of hexagonal system. Therefore, it is impossible to realize a semiconductor laser having an active layer that consists of the III-V compound semiconductor layer containing N as a constituent element and a having zinc blende structure of cubic system referring to the technique disclosed in the Gazette. Such reasoning is based on the fact that both crystal structures are essentially different from each other.

The present inventors have considered the fact that, by using a semiconductor multilayer film that lattice-matches the GaAs substrate as a mirror, a vertical cavity surface emitting laser comprising a GaAs substrate and an active layer made of GaInNAs can be implemented. A still further characterizing feature of the present invention is based on such a view. That is to say, a still further semiconductor laser provided by the present invention has a configuration including a GaAs substrate, an active layer made of GaInNAs, and upper and lower mirrors at least one of which is composed of low-refractivity semiconductor layers lattice-matching the GaAs substrate and high-refractivity semiconductor layers lattice-matching the GaAs substrate wherein both layers are stacked alternately upon each other and the upper and lower mirrors are placed above and beneath the active layer, respectively.

As a result, since the low-refractivity layers, the high-refractivity layers and the active layer can be used in a state of lattice-matching the substrate, it is possible to implement a stable practical long-wavelength vertical cavity surface emitting laser with no crystal defects generated.

The structure of the active layer mentioned above also can be applied to a well layer of the quantum well structure in which the light-emitting region (i.e., an optically active region,) is formed with a well layer (well layers) and barrier layers with wider bandgap than said well layer. One preferred semiconductor laser device according to the present invention, mentioned above, comprises a reflector region (i.e, a mirror region) having a laminated structure (i.e., a stacked structure) of two kinds of semiconductor layers, the refractive indices of which are mutually different, formed above a GaAs substrate and an active layer of $Ga_xIn_{1-x}N_yAs_{1-y}$ formed above said reflector region, and is characterized in that each of said substrate, said reflector region, and said active layer has a crystalline structure of cubic system (e.g. zinc blende structure). The composition ratio x of Ga and In and the composition ratio y of N and As in said active layer of GaInNAs are set to be suitable for a wavelength according to the intended use of said semiconductor laser ($0 \leq x \leq 1$, $0 < y \leq 1$, and preferably $0 < x < 1$, $0 < y < 1$). In this example, the reflector structures of this invention mentioned before can also be applied to said reflector region, so that the low-refractivity semiconductor layers thereof can be formed of $Al_u In_{1-u} P$, or the high-refractivity semiconductor layers thereof can be formed of $Ga_v In_{1-v} N_z As_{1-z}$ preferably, $0 < u < 1$, $0 < v < 1$, and $0 < z < 1$).

When GaInNAs is used for making a distributed Bragg reflector of such a large-wavelength vertical cavity surface emitting laser, it is desirable to set the band gap of GaInNAs of the distributed Bragg reflector at a value greater than the band gap of the active layer by adjusting the alloy composition in order to prevent laser light from being absorbed by the distributed Bragg reflector.

In addition, since GaInNAs of the active layer can be created on the GaAs substrate, GaInNAs can be combined with a semiconductor material having a large band gap such as AlInP, AlGaInP, GaInP, GaInPAs or AlGaAs. Such combination allows electron confinement to be strengthened and the amount of leakage current at room temperature to be reduced. The combination is implemented by using such a semiconductor having a large band gap in the semiconductor distributed Bragg reflector and a cladding layer in order to realize the operation of the vertical cavity surface emitting layer using GaInNAs in the active layer thereof at room temperature.

It is possible to have the semiconductor distributed Bragg reflector and the active layer described above experience a stable crystal-growing process on the substrate. As a result, the semiconductor distributed Bragg reflector and the active layer can be created by using one of a chemical beam epitaxy method, a molecular beam epitaxy method and an organo-metallic vapor phase epitaxy method.

Since the vertical cavity surface emitting laser comprises a small number of stacked pairs of layers of low-refractivity and high-refractivity materials, the height thereof can be reduced. As a result, the vertical cavity surface emitting laser can be integrated with other semiconductor devices on the same substrate crystal with ease, allowing an optical transmitter-receiver module of a large-scale integration to be implemented.

A semiconductor distributed Bragg reflector has been explained. As described above, not only can both the upper and lower mirrors be made of a semiconductor distributed Bragg reflector, but one of the mirrors can also be a distributed Bragg reflector made of a dielectric material. For example, if the lower mirror is a semiconductor distributed Bragg reflector, the upper mirror can be implemented by a dielectric-material distributed Bragg reflector.

It should be noted that, by the technical term "lattice matching" adopted in the present invention, a technique for suppressing misfit dislocation is implied. Even with the lattice matching implemented, a small amount of lattice mismatching is tolerated. Typically, a lattice-mismatching degree in the range ±0.5% is acceptable.

These and other objects as well as many of the attendant advantages of the present invention will be readily appreciated as the same becomes better understood by reference to the following detailed description when considered in connection with the accompanying drawings.

DETAILED DESCRIPTION OF THE PREFERRED EMBODIMENTS

The present invention will become more apparent from the following detailed description of preferred embodiments exemplified with reference to the accompanying illustrations in the drawings.

First Embodiment

Figure 2:
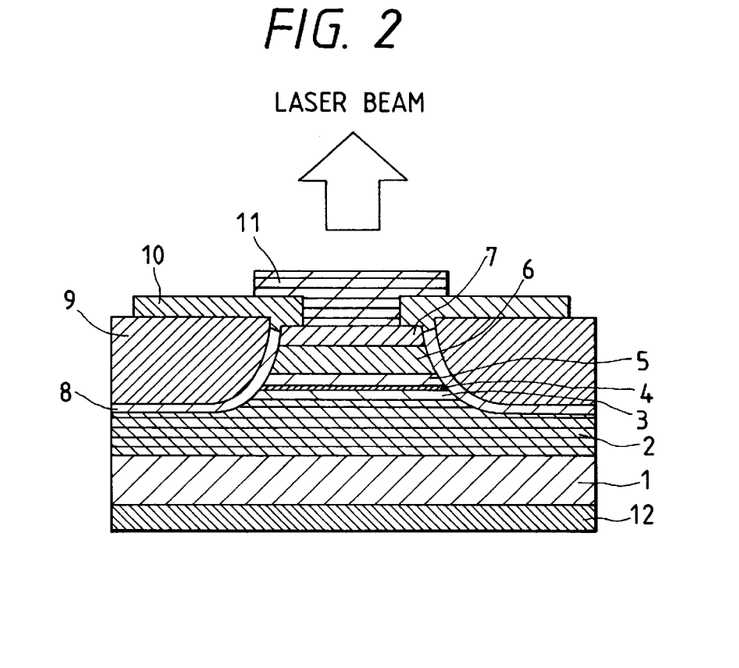
FIG. 2 is a cross-sectional view of a vertical cavity surface emitting laser provided by a first embodiment of the present invention.

A vertical cavity surface emitting laser of an embedded-polyimide type with an oscillation wavelength in the 0.98 µm range is shown in FIG. 2. Reference numeral 1 shown in the figure is an n-GaAs substrate with a donor density of $1 \times 10^{18}$ cm$^{-3}$ whereas reference numeral 2 is an n-semiconductor distributed Bragg reflector having a donor density of $1 \times 10^{18}$ cm$^{-3}$. Reference numerals 3 and 4 denote a GaAs spacer and a GaInAs/GaAs strained quantum well active layer, respectively. Reference numeral 5 is also a GaAs spacer and reference numeral 6 is a p-GaInP cladding layer which lattice-matches the GaAs substrate 1. The p-GaInP cladding layer 6 has an acceptor density of $1 \times 10^{18}$ cm$^{-3}$. Reference numeral 7 is a contact layer having an acceptor density of $1 \times 10^{19}$ cm$^{-3}$.

Included in the active layer 4 are three $Ga_{0.85}In_{0.15}As$ layers each with a thickness of 7 nm and separated from each other by GaAs barrier layers each having a thickness of 10 nm to form a strained quantum well layer having effectively a band gap of 1.27 eV (a wavelength of 0.98 µm).

The semiconductor distributed Bragg reflector 2 comprises high-refractivity GaAs layers each having a thickness equal to ¼ of the wavelength in the semiconductor and low-refractivity AlInP layers each having a thickness equal to ¼ of the wavelength in the semiconductor. The high-refractivity GaAs layers and the low-refractivity AlInP layers are stacked on each other alternately. The content ratio of Al in the III-group elements is set at 50% in the case of the AlInP low-refractivity layer so as to make the AlInP low-refractivity layer lattice-match the GaAs substrate 1. In order to increase the reflectivity to a value equal to or greater than 99%, the number of pairs in the mirror layer is set at 12.

The semiconductor layers 2 to 7 are created one after another in a crystal-growth process by using a chemical beam epitaxy apparatus in an environment with a high degree of vacuum of $1\times10^{-5}$ Torr. It should be noted that, for the crystal-growth process, another apparatus such as a molecular beam epitaxy apparatus or an organo-metallic vapor phase epitaxy apparatus can also be used as well. Organic metals alane, triethylgallium and trimethylindium are used as precursors for producing aluminum, gallium and indium of the III group, respectively. As for the precursors for producing phosphorus and arsenic of the V group, phosphine and arsine are used, respectively. Silicon and beryllium are used as precursors for producing the n-type and p-type impurities, respectively. The temperature of the crystal-growth process is set at 500° C.

Next, a circular $SiO_2$ film with a diameter of 10 $\mu$m is created by using a chemical vapor deposition (CVD) process and a lithography process. Being removed in a later process, the $SiO_2$ film is not shown in FIG. 2. With the circular $SiO_2$ film used as a mask, the n-semiconductor distributed Bragg reflector 2 undergoes a wet-etching process to the middle of the depth thereof to create a mesa shape. Thereafter, with the circular $SiO_2$ mask left as it is, an $SiO_2$ cover layer 8 is created by using a chemical vapor deposition process. Subsequently, the $SiO_2$ cover layer 8 is coated with polyimide which is then hardened to create a polyimide film 9.

Next, the polyimide film 9 is etched by using a reactive ion beam etching process till the $SiO_2$ mask is exposed then the $SiO_2$ mask on the mesa is removed to create a plane surface. Thereafter, a ring-shaped p-electrode 10 is created by using a lift-off technique and a dielectric-material distributed Bragg reflector 11 is then created by using a sputter evaporate method before an n-electrode 12 is created. The dielectric-material distributed Bragg reflector 11 is created by stacking high-refractivity amorphous Si layers each having a thickness equal to ¼ of the wavelength in the dielectric material and low-refractivity $SiO_2$ layers each having a thickness equal to ¼ of the wavelength in the dielectric material upon each other, alternately. The number of pairs is set at 4 in order to give a reflectivity of equal to or greater than 99%.

When a current is injected into the manufactured vertical cavity surface emitting laser, a laser light is emitted from the dielectric-material distributed Bragg reflector side with an oscillation wavelength of 0.98 $\mu$m at room temperature. Using no material with deliquescence, the vertical cavity surface emitting laser has a long device life of equal to or longer than 100,000 hours.

In the case of the present embodiment, the amorphous Si and $SiO_2$ layers of a certain material group are used for creating the dielectric-material distributed Bragg reflector of the vertical cavity surface emitting laser as described above. Since the dielectric-material distributed Bragg reflector is created by stacking high-refractivity layers and low-refractivity layers upon each other alternately, however, a pair of materials of another group such as SiN and $SiO_2$, amorphous Si and $SiN_x$ or $TiO_2$ and $SiO_2$ can also be used as well.

Figure 3:
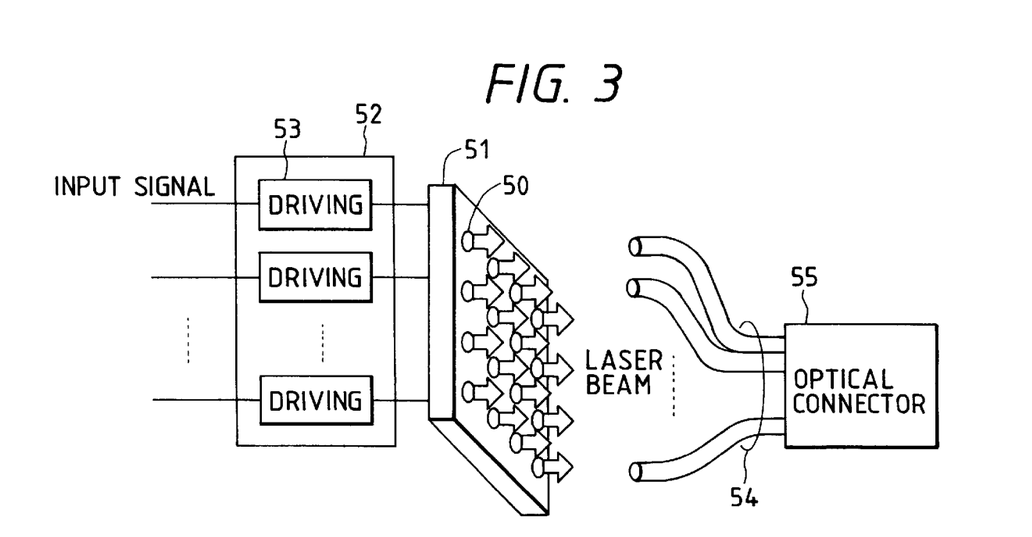
FIG. 3 is a layout-configuration diagram used for explaining a typical optical transmitter module provided by the present invention.

The vertical cavity surface emitting laser described above is created by integration as an array device occupying a two-dimensional area of 4×4. The array device and a chip resulting from integration of a circuit for driving the lasers are combined with an optical-fiber bundle (a bundle of 16 optical fibers) to form an optical transmitting module (optical interconnection module) which is shown in FIG. 3. Reference numeral 51 shown in the figure is the laser array device and reference numeral 52 is the IC (integrated circuit) chip in which the driving circuit 53 is integrated. Reference numeral 54 is the bundle of optical fibers and reference numeral 55 is an optical connector. Each of the vertical cavity surface emitting lasers transmits a signal with a rate of 200 Mb/second. As a result, the entire module generates signals of 3.2 Gb/second (=200 Mb/second×16).

Figure 4:
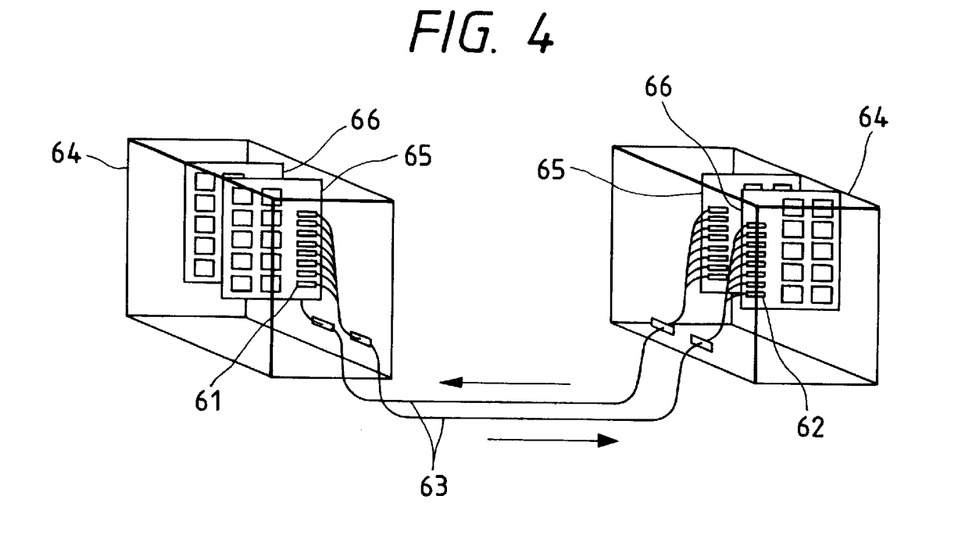
FIG. 4 is a layout-configuration diagram used for explaining a typical parallel processing system employing the optical transmitter module shown in FIG. 3.

Eight optical transmitter modules are used for connecting two computers to form a parallel information processing apparatus. FIG. 4 shows the configuration of such an apparatus. Reference numeral 61 shown in the figure is the optical transmitter module while reference numeral 62 is an optical receiver module composed of a two-dimensional photo-diode array. Reference numerals 63 and 64 are an optical-fiber array and a computer, respectively. Reference numeral 65 is a transmission board of the computer 64 and reference numeral 66 is a receiver board of the computer 64. Signals conveying a large amount of data of 3.2 Gb/second× 8=25.6 Gb/second are exchanged between the two computers 64.

It should be noted that the vertical cavity surface emitting laser provided by the present invention can also be used as a single device without integration with others.

Second Embodiment

Figure 5:
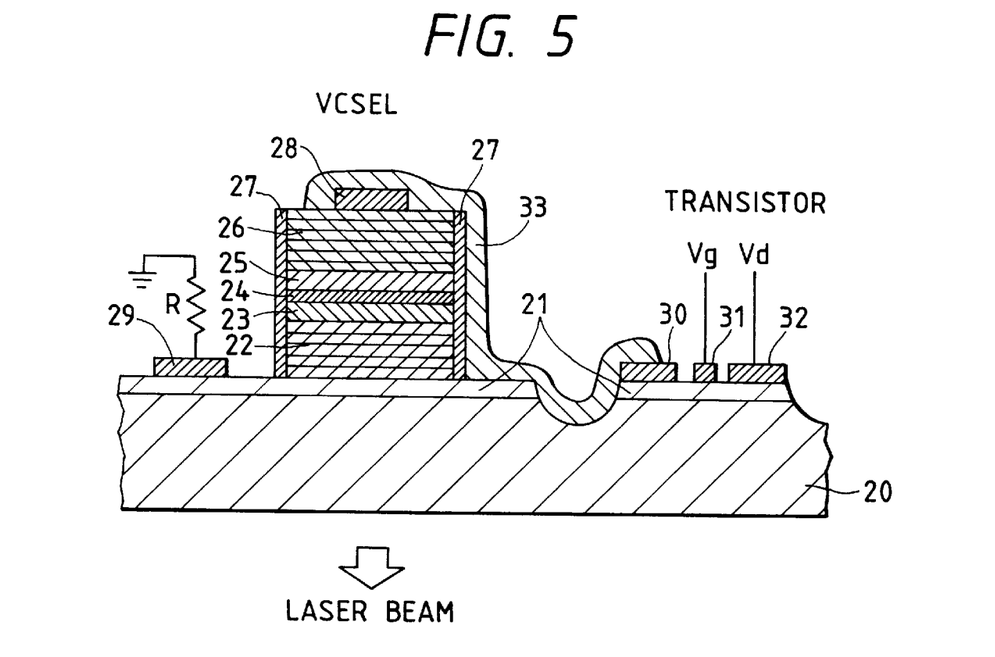
FIG. 5 is a cross-sectional view of a vertical cavity surface emitting laser provided by a second embodiment of the present invention.

An air-post-type vertical cavity surface emitting laser with an oscillation wavelength of 0.98 $\mu$m created by integrating a driving MES-FET transistor on the substrate is shown in FIG. 5. The semiconductor laser is shown on the left side of the figure whereas the transistor is shown on the right side thereof. Reference numeral 20 shown in the figure is a semi-insulating GaAs substrate and reference numeral 21 is an n-GaAs buffer layer with a donor density of $1\times10^{17}$ $cm^{-3}$. Reference numeral 22 shown on the left side of the figure is an n-semiconductor distributed Bragg reflector with a donor density of $1\times10^{18}$ $cm^{-3}$ and reference numeral 23 is a $Ga_{0.82}In_{0.18}P_{0.37}As_{0.63}$ spacer. Reference numeral 24 is a GaInAs/GaInPAs strain-compensated quantum well active layer and reference numeral 25 is another GaInPAs spacer. Reference numeral 26 is a p-semiconductor distributed Bragg reflector with an acceptor density of $1\times10^{19}$ $cm^{-3}$. The buffer layer 21 is added to the semiconductor-laser region and created on an area up to the transistor region.

Included in the active layer 24 are five $Ga_{0.85}In_{0.15}As$ layers each with a thickness of 7 nm and separated from each other by tensile strain $Ga_{0.88}In_{0.12}P_{0.29}As_{0.71}$ barrier layers each having a thickness of 6 nm to form a strain-compensated quantum well layer having, effectively, a band gap of 1.27 eV (a wavelength of 0.98 $\mu$m). The semiconductor distributed Bragg reflectors 22 and 26 each comprise $Ga_{0.95}In_{0.05}N_{0.01}As_{0.99}$ layers each having a thickness equal to ¼ of the wavelength in the semiconductor and $Al_{0.5}In_{0.5}P$ layers each having a thickness equal to ¼ of the wavelength in the semiconductor. The GaInNAs layers and AlInP layers are stacked on each other, alternately. The content ratio of each of the layers is set so that the layers lattice-match the GaAs substrate 20 and the buffer layer 21. It should be noted that the content ratio of Al in the III-group elements of the AlInP layer is set at 50%. In order to increase the reflectivity to a value equal to or greater than 99%, the number of pairs in the mirror layer is set at 11.

The semiconductor layers 21 to 26 are created one after another in a crystal-growth process by using a molecular beam epitaxy apparatus in an environment with a high degree of vacuum of $1 \times 10^{-4}$ Torr. It should be noted that, for the crystal-growth process, another apparatus such as the chemical beam epitaxy apparatus or the organo-metallic vapor phase epitaxy apparatus can also be used as well. As precursors for producing aluminum, gallium and indium of the III group, their respective metals are used. As for the precursors for producing phosphorus and arsenic of the V group, phosphine and arsine are used, respectively. As a precursor of N, nitrogen molecules activated by an rf plasma is used. The nitrogen molecules can also be activated by another means such as an ECR (Electron Cyclotron Resonance) plasma. Si and $CBr_4$ are used as precursors for producing the n-type and p-type impurities respectively. The temperature of the crystal-growth process is set at 500° C.

Next, a reactive ion beam etching process is carried out through the depth up to the surface of the buffer layer 21, leaving a cylindrical light emitting region with a diameter of 5 μm as shown in FIG. 5. Thereafter by using a chemical vapor deposition, an $SiO_2$ cover layer 27, a p-side electrode 28 and an n-side electrode 29 are created to produce the vertical cavity surface emitting laser.

Next, fabrication of the transistor portion on the right side of FIG. 5 is explained. First of all, the external part of the transistor is etched to the semi-insulating substrate 20 in order to separate elements. Thereafter, a source electrode 30, a gate electrode 31 and a drain electrode 32 are created, completing the fabrication of the MES-FET transistor.

Finally, an electrical wire 33 is created by depositing aluminum. The electrical wire 33 is used for connecting the source electrode 30 of the transistor and the p-side electrode 28.

Since the number of pairs in the distributed Bragg reflector of the vertical cavity surface emitting laser provided by the present invention is only a fraction of the number of pairs in the conventional device, the height of the vertical cavity surface emitting laser provided by the present invention is also a fraction of the height of the conventional device. As a result, the electrical wire 33 can be created with a uniform thickness, allowing a broken wire on the side portion of the vertical cavity surface emitting laser, a problem encountered in the conventional device, to be avoided. As a result, it is possible to substantially increase the yield of the device.

Electrical wires for connecting the n-side electrode 29 of vertical cavity surface emitting laser, the gate electrode 31 and the drain electrode 32 of the transistor are created with ease in the same way as the conventional wiring technology. FIG. 5 is a simplified diagram showing these electrical wires.

Next, the operation of the present integrated circuit is explained. With the transistor put in a turned-on state, a current flows from the drain electrode 32 to the source electrode 30 when a voltage Vd is applied to the drain electrode 32. As a result, a current is injected to the vertical cavity surface emitting laser by way of the electrical wire 33, causing the vertical cavity surface emitting laser to generate an oscillating laser. At room temperature, a laser with an oscillation wavelength of 0.98 μm is emitted from the substrate side. The transistor is controlled to turn on and off by the voltage Vg applied to the gate electrode 31, controlling the current injected to the laser. The magnitude of the current is determined by a resistor R connected to the n-side electrode 29 of the vertical cavity surface emitting laser.

Using no material with deliquescence, the vertical cavity surface emitting laser provided by the present embodiment has a long device life of equal to or longer than 100,000 hours. In addition, the number of pairs in the semiconductor distributed Bragg reflector is only a fraction of that of the conventional device. Since GaInNAs is used for creating the p-reflector, the series resistance of the semiconductor distributed Bragg reflector can be decreased. By designing a two-dimensional array through integration of the semiconductor laser and the transistor, an optical transmitter-receiver module having a small size can be built. The optical transmitter-receiver module can be used as light source in a digital processing system, a system for carrying out parallel processing.

In the case of the present embodiment, the vertical cavity surface emitting laser and the MES-FET transistor are integrated into a single chip, as described above. It is needless to say that other semiconductor devices including resistors and capacitors can also be integrated therein as well. On the other hand, the vertical cavity surface emitting laser provided by the present embodiment can also be used as a single device without integration with others.

Figure 6:
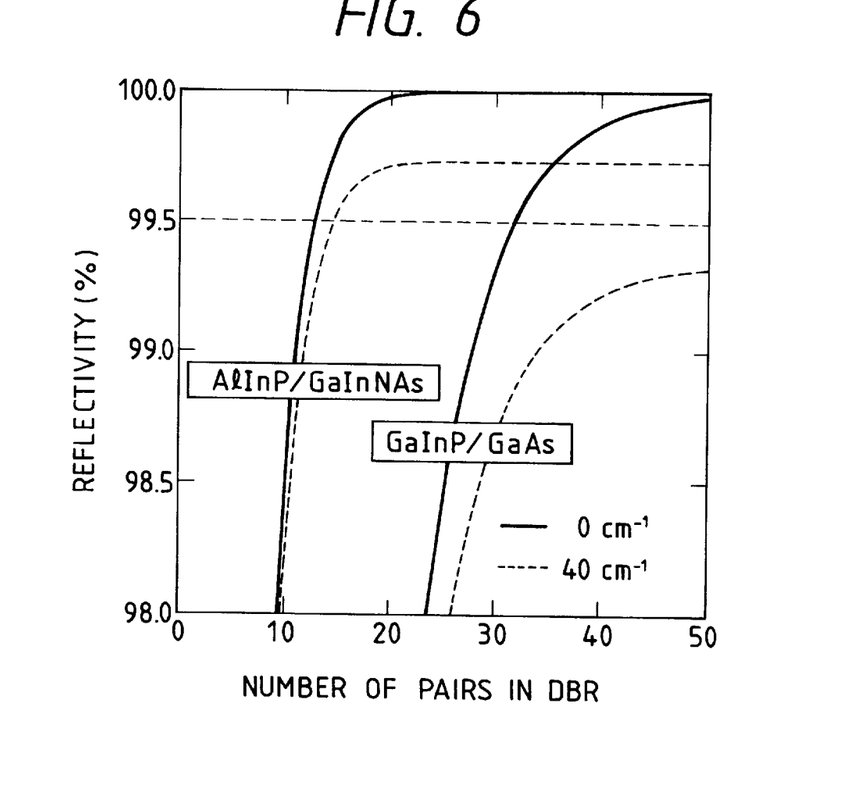
FIG. 6 is an explanatory diagram showing curves each representing a relation between the number of pairs in the distributed Bragg reflector and the reflectivity thereof.

It should be noted that relations between the number of pairs and the reflectivity of the distributed Bragg reflector of the AlInP/GaInNAs family employed in the present embodiment have been examined. FIG. 6 is a diagram showing results of comparison of the distributed Bragg reflector of the AlInP/GaInNAs family with the conventional distributed Bragg reflector of the GaInP/GaAs family. Solid lines represent relations between the number of pairs and the reflectivity of the distributed Bragg reflector with no loss whereas dashed lines represent relations between the number of pairs and the reflectivity of the distributed Bragg reflector with an amount of loss of 40 $cm^{-1}$. First of all, the relations between the number of pairs and the reflectivity of the distributed Bragg reflector with no loss are explained. In the case of the distributed Bragg reflector of the AlInP/GaAs family, a pair count of 32 is required in order to achieve a target reflectivity of 99.5%. In the case of the distributed Bragg reflector of the AlInP/GaInNAs family, on the other hand, a pair count of only 13 is required, allowing the number of pairs to be reduced to ⅓. This number of pairs is smaller than the 16 pairs of the conventional distributed Bragg reflector of the AlAs/GaAs family which is chemically unstable.

Subsequently, the relations between the number of pairs and the reflectivity of the distributed Bragg reflector with an amount of loss of 40 $cm^{-1}$ are explained. The distributed Bragg reflector of the AlInP/GaInNAs family provides a reflectivity of 99.5% at a pair count of 15. In the case of the conventional distributed Bragg reflector of the GaInP/GaAs family, on the other hand, the reflectivity is saturated at 99.3%, never achieving 99.5% no matter how high the number of pairs is increased. In an actual distributed Bragg reflector, the amount of loss is of the order of 40 $cm^{-1}$ in some cases. It is thus obvious that the distributed Bragg reflector of the AlInP/GaInNAs family is very effective in the reduction of the number of pairs and the preservation of a high reflectivity.

The results described above hold true of a distributed Bragg reflector made of pairs of stacked layers of AlInP and GaInNAs which lattice-match the GaAs substrate. It should be noted that the same results can also be obtained for strained layers as long as dislocation due to lattice mismatching does not occur. In addition, stress compensation can be implemented for a strained layer so that no crystal defect is generated. Also in this case, the effect of allowing the number of layers to be reduced can be realized as well.

Third Embodiment

Figure 7:
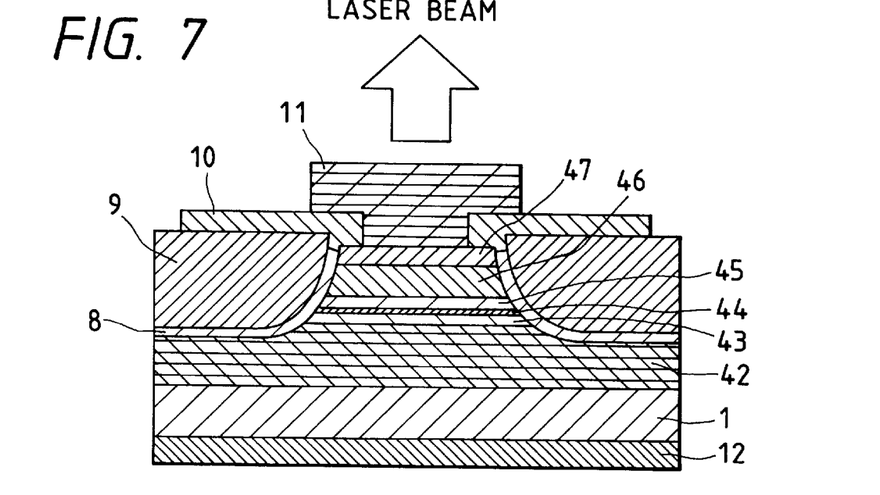
FIG. 7 is a diagram showing a cross section of a vertical cavity surface emitting laser provided by a third embodiment of the present invention.

A vertical cavity surface emitting laser with a wavelength in the 1.3 μm range is shown in FIG. 7. Reference numeral 1 shown in the figure is an n-GaAs substrate with a donor density of $1 \times 10^{18}$ cm$^{-3}$ and reference numeral 42 is an n-semiconductor distributed Bragg reflector with a donor density of $1 \times 10^{18}$ cm$^{-3}$ and reference numeral 43 is a GaAs spacer. Reference numeral 44 is a $Ga_{0.8}In_{0.2}N_{0.04}As_{0.96}$ no-strain active layer and reference numeral 45 is another GaAs spacer. Reference numeral 46 is a p-$Al_{0.3}Ga_{0.7}$ As cladding layer with an acceptor density of $1 \times 10^{18}$ cm$^{-3}$ and reference numeral 47 is a p-GaAs contact layer with a donor density of $1 \times 10^{19}$ cm$^{-3}$.

Included in the active layer 44 are undoped GaInNAs layers each with a band gap of 0.95 eV for a wavelength of 1.3 μm. The GaInNAs layers lattice-match the n-GaAs substrate 1. The semiconductor distributed Bragg reflector 42 comprises $Ga_{0.9}In_{0.1}N_{0.01}As_{0.99}$ layers each having a thickness equal to ¼ of the wavelength in the semiconductor and $Ga_{0.5}In_{0.5}P$ layers each having a thickness equal to ¼ of the wavelength in the semiconductor. The GaInNAs layers and GaInP layers are stacked on each other, alternately. The content ratios of each of the layers are set so that the layers lattice-match the n-GaAs substrate 1 and the buffer layer 21. In order to increase the reflectivity to a value equal to or greater than 99%, the number of pairs in the mirror 42 is set at 27.

The semiconductor layers 42 to 47 are created one after another in a crystal-growth process by using an organo-metallic vapor phase epitaxy apparatus in an environment with a low degree of vacuum of $1 \times 10^{-1}$ Torr. It should be noted that, for the crystal-growth process, another apparatus such as the molecular beam epitaxy apparatus or the chemical beam epitaxy apparatus can also be used as well. As precursors for producing Ga and In, trimethylgallium and trimethylindium are used, respectively. As for the precursors for producing phosphorus and arsenic, phosphine and arsine are used, respectively. As a precursor of N, tertyarybuty-lamine is used. Disilane and dimethylzinc are used as precursors for producing the n-type and p-type impurities, respectively. The temperature of the crystal-growth process is set at 600° C.

Next, a circular SiO$_2$ film with a diameter of 10 μm is created by using a chemical vapor deposition (CVD) process and a photoresist process. With the circular SiO$_2$ film used as a mask, the n-semiconductor distributed Bragg reflector 2 undergoes a wet-etching process to the middle of the depth thereof to create a mesa shape. Thereafter, with the circular SiO$_2$ mask left as it is, an SiO$_2$ cover layer 8 is created by using a chemical vapor deposition process. Subsequently, the SiO$_2$ cover layer 8 is coated with polyimide which is then hardened to create a polyimide film 9. Next, the polyimide film 9 is etched by using a reactive ion beam etching process till the SiO$_2$ mask is exposed then the SiO$_2$ mask on the mesa is removed to create a plane surface.

Thereafter, a ring-shaped p-electrode 10 is created by using a lift-off technique and a dielectric-material distributed Bragg reflector 11 is then created by using a sputter evaporate method before an n-electrode 12 is created. The dielectric-material distributed Bragg reflector 11 is created by stacking high-refractivity amorphous Si layers each having a thickness equal to ¼ of the wavelength in the dielectric material and low-refractivity SiO$_2$ layers each having a thickness equal to ¼ of the wavelength in the dielectric material upon each other alternately. The number of pairs is set at 5.

The vertical cavity surface emitting laser provided by the present embodiment generates a stable oscillating laser with a wavelength of 1.3 μm at room temperature. Using no material with deliquescence, the vertical cavity surface emitting laser has a long device life of equal to or longer than 100,000 hours.

Next, the content ratio of GaInNAs used for creating the active layer 44 is changed to another predetermined value in order to fabricate a vertical cavity surface emitting laser with an oscillation wavelength having a value in the 1.55 μm range. The wavelengths 1.3 μm and 1.55 μm coincide with a wavelength range used in optical-fiber communication. Both the semiconductor lasers can each be integrated to form an array device or used as a single device. Such a single device is used as a light source in an optical-fiber communication system.

In the embodiment described above, the oscillation wavelengths are 1.3 μm and 1.55 μm. It should be noted, however, that by further changing the content ratio of GaInNAs, the wavelength can be further increased. As described above, as a rule, it is possible to set the band gap at 0 eV as described earlier so that the wavelength can be increased infinitely. Taking the practical use of the mirror into consideration, however, the wavelength is set at a value in the infrared range.

Fourth Embodiment

Figure 8:
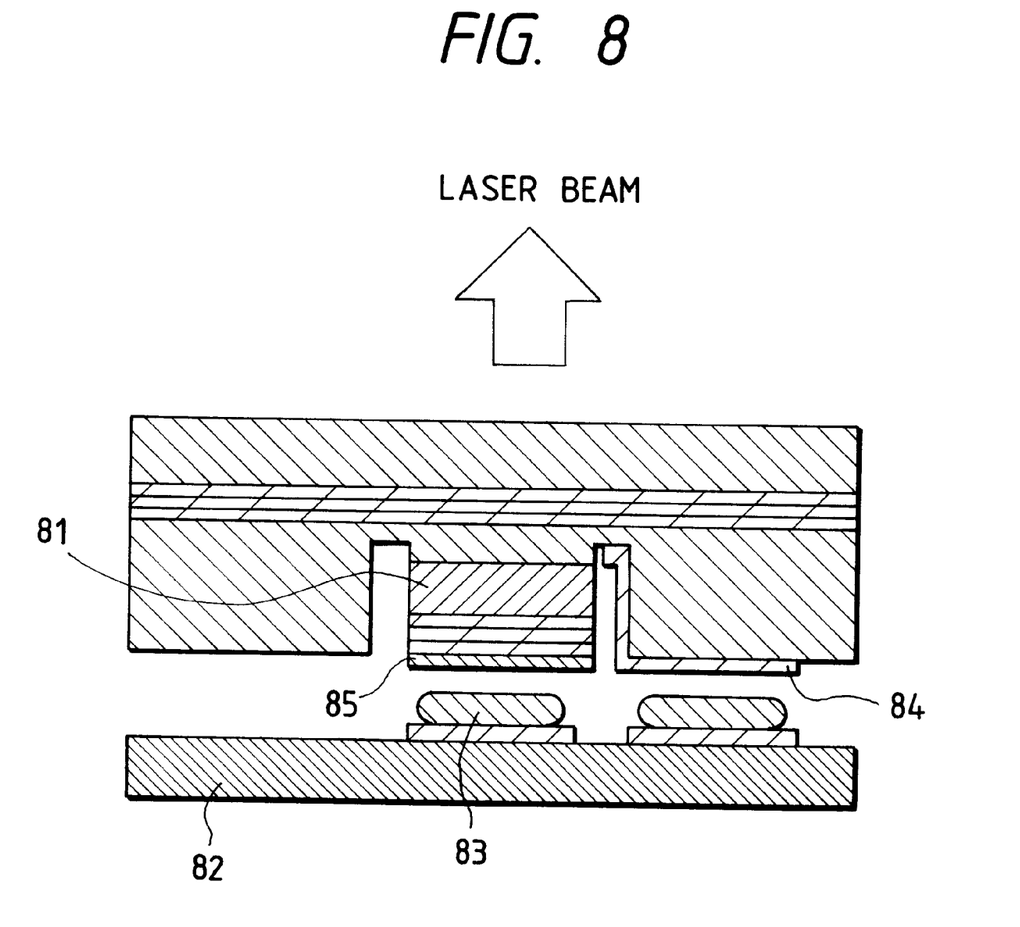
FIG. 8 is a cross-sectional view of device implementation used for explaining a fourth embodiment of the present invention.
Figure 9:
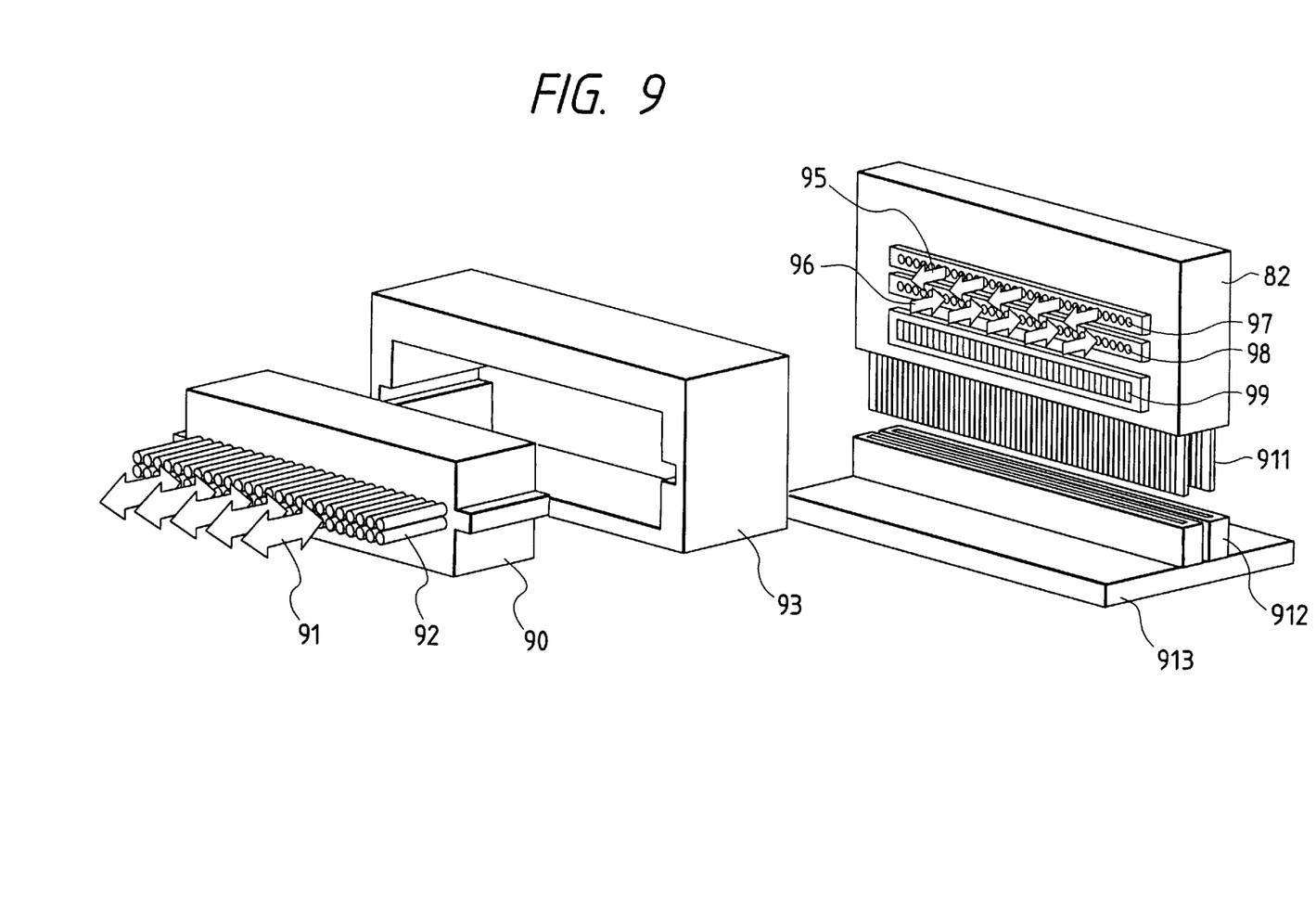
FIG. 9 is a diagram showing the structure of an optical transmitter-receiver module used for the fourth embodiment of the present invention.

FIGS. 8 and 9 are diagrams showing an optical transmitter-receiver module (an optical interconnection module) obtained by implementing a vertical cavity surface emitting laser provided by the present invention on an implementation substrate by using a flip-chip-bonding technique and implementing a surface photo detector on the same implementation substrate also by using the flip-chip-bonding technique. To be more specific, FIG. 8 is a diagram showing the implementation of the vertical cavity surface emitting laser on the implementation substrate whereas FIG. 9 is a diagram showing the structure of the transmitter-receiver module.

Reference numeral 81 shown in FIG. 8 is the vertical cavity surface emitting laser and reference numeral 82 is the implementation substrate. Reference numerals 83 and 84 are a solder bump and one of the electrodes of the vertical cavity surface emitting laser 81, respectively. Reference numeral 85 denotes the other electrode of the vertical cavity surface emitting laser 81. As the vertical cavity surface emitting laser 81, the device shown in FIG. 2 is used. However, the device shown in FIG. 7 can also be used as well.

On the other hand, the implementation of the surface photo detector is not illustrated in the figures but the implementation can be shown by a structure wherein the vertical cavity surface emitting laser of FIG. 8 is replaced by the surface photo detector. For an optical wavelength in the 1.3 μm range, the surface photo detector can also be made of the InGaAs material. By using this material, a good optical-electro conversion efficiency can be obtained. It should be noted that, for an optical wavelength in the visible-light range, the use of the Si material is advantageous from both the manufacturing cost and the optical-electro conversion efficiency points of view.

By using the flip-chip-bonding technique shown in FIG. 8, it is possible to obtain a high-speed driving capability, a simplified implementation process and easy position adjustment in the optical transmitter-receiver module. As shown in the figure, with the flip-chip-bonding technique, the electrodes 84 and 85 for supplying a current to the vertical cavity surface emitting laser 81 are created on the same device surface. A laser beam is emitted from the back surface of the device substrate on the opposite side to the device surface.

In the case of the surface photo detector, an incident laser beam is inputted to the back surface of the device substrate on the opposite side to the device surface.

On the substrate 82 for implementing the device (that is, the vertical cavity surface emitting laser and the surface photo detector), circuits and wires are implemented over a wide bandwidth. The bandwidth is wider than the driving-frequency bandwidth of the optical transmitter-receiver module. A solder bump is provided on a bonding pad of the substrate 82 having such a wide bandwidth. The device is implemented with the device turned upside down by bringing the bonding pad of the device into contact with the solder bump in a state of being heated to a temperature equal to or higher than a solder melting temperature and then adhering the bonding pad to the solder bump.

With the flip-chip-bonding technique, the inductance can be reduced to a small value in comparison with a wire-bonding technique which is generally adopted. As a result, the flip-chip-bonding technique is advantageous for obtaining a high-speed driving capability of the device. Since the process of implementing the device on the substrate 82 is simple and the positional displacement can be made small, highly accurate positional adjustment can be carried out with ease.

Only one device is shown in FIG. 8 for the sake of simplicity. It should be noted, however, that it is possible to integrate a plurality of devices on the same device substrate 82, provide electrodes to each of the devices and implement the devices on the device substrate 82 at the same time.

The explanation goes on to FIG. 9. Reference numeral 92 shown in the figure is an optical fiber coupled with the vertical cavity surface emitting laser 81 and the surface photo detector. Reference numeral 93 is a fiber ferrule for accommodating the optical fiber 92 and reference numeral 90 is a fiber-ferrule guide for guiding the fiber 92. Reference numeral 91 is an input/output optical signal. Reference numerals 95 and 96 are an output optical signal and an input optical signal respectively. Reference numeral 97 is a vertical cavity surface emitting laser array created by integrating the vertical cavity surface emitting lasers 81 into the shape of an array. Reference numeral 98 is a surface photo detector array created by integrating the surface photo detectors into an array. Reference numeral 99 is a driving IC for driving the vertical cavity surface emitting laser array 97 and the surface photo detector array 98. Reference numeral 913 is a mother board for mounting the implementation substrate 82 and reference numeral 911 is a signal-pin array provided on the implementation substrate 82 for connecting the implementation substrate 82 to the mother board 913. Reference numeral 912 is a signal-pin socket provided on the mother board 913 for seating the signal-pin array 911.

Electrical signals coming from the mother board 913 are converted into optical signals by the present transmitter-receiver module. Optical signals are converted into electrical signals. An electrical signal is transmitted through an optical fiber as an optical signal. The vertical cavity surface emitting lasers and the surface photo detectors are each monolithically integrated and created into a shape of a one-dimensional array. It should be noted that the implementation of the vertical cavity surface emitting lasers and the surface photo detectors is not limited to a one-dimensional array but the vertical cavity surface emitting lasers and the surface photo detectors can also be each implemented into a two-dimensional array as well. The vertical cavity surface emitting laser array 97 and the surface photo detector array 98 are implemented on the implementation substrate 82 by using the flip-chip-bonding technique shown in FIG. 8. Then, an integrated circuit incorporating a driving circuit for driving the vertical cavity surface emitting laser array 97 and the surface photo detector array 98 is mounted on the implementation substrate 82. Such implementation allows the lengths of wires to be decreased substantially. As a result, the degree of deterioration of a surface caused by wires can also be lowered as well. A ribbon-type optical fiber 92 is employed as an optical fiber used for each device in the vertical cavity surface emitting laser array 97 and the surface photo detector array 98. By providing each optical fiber so that the end surface thereof is brought into contact with the associated device in the vertical cavity surface emitting laser array 97 or the surface photo detector array 98, the optical fiber can be coupled optically with the device without the need to see an optical device such as a lens. In the case of an optical fiber having a core diameter of 50 $\mu$m and a device also having an optical incidence/emission diameter of the order of 50 $\mu$m, by setting the gap between the optical fiber and the device at a value equal to or smaller than 10 $\mu$m, it is possible to implement a high optical coupling efficiency exceeding 50%. In this case, if a variation in power of 50% is allowed, it is possible to obtain a positional-adjustment range of about ±5 $\mu$m, a value which can be realized with ease.

When the mother board 913 is installed on an apparatus for accommodating the mother board 913, it is desirable to have the ribbon-type optical fibers 92 and the mother board 913 in parallel positional relation. For this reason, the implementation substrate 82 is provided perpendicularly to the mother board 913 so that the devices of the vertical cavity surface emitting laser array 97 and the surface photo detector array 98 are also oriented perpendicularly to the end surfaces of the optical fibers. The implementation board 82 and the mother board 913 are connected to each other by the signal-pin array 911 and the signal-pin socket 912.

The positional relation between the ribbon-type optical fibers 92 and the devices of the vertical cavity surface emitting laser array 97 and the surface photo detector array 98 is maintained by a guide mechanism which comprises the fiber ferrule 93 and the fiber-ferrule guide 90.

It should be noted that, in order to protect the devices of the vertical cavity surface emitting laser array 97 and the surface photo detector array 98 against the open air, the upper surface of each of the devices is covered with a film made of an acrylic material having a thickness of 7 $\mu$m. It should be worth nothing, however, that the cover is not limited to such a material. Another thin-film material can also be used as well as long as the thickness and the refractivity of the material do not disturb the optical coupling condition between the end surfaces of the optical fibers and the devices.

According to the configuration of the optical transmitter/receiver module described above, the number of components can be reduced and a high accuracy of the positional adjustment of the optical fibers and the devices can be implemented. As a result, it is possible to improve the handiness of the optical transmitter/receiver module, to reduce the cost of the implementation of the optical transmitter/receiver module and to increase the positional-adjustment tolerance.

According to the present invention, since semiconductor materials having large refractivity differences are used for creating the mirror, a high reflectivity can be obtained with a small number of pairs. In addition, using no material with deliquescence, the vertical cavity surface emitting laser having a long device life can be implemented. Since the number of pairs is small, the height of the laser can be reduced, allowing integration with other devices to be implemented with ease. As a result, an optical transmitter-receiver module of a large scale of integration can be realized. In addition, since the GaInNAs material is used for creating the active layer, the vertical cavity surface emitting laser can generate a oscillating laser with a wavelength of 1.3 µm or 1.55 µm in a stable manner at room temperature. Having the characteristics described above, the vertical cavity surface emitting laser can be used widely in optical interconnection modules, computers, parallel processing systems and communication systems to name a few.

It is further understood by those skilled in the art that the foregoing description is preferred embodiments of the disclosed device and that a variety of changes and modifications may thus be made in the present invention without departing from the spirit and the scope thereof.

What is claimed is:

1. A vertical cavity surface emitting laser emitting a laser light in a direction normal to the surface of a crystal substrate thereof, said laser having:
    an active layer above said crystal substrate, said active layer used for emitting a light; and
    a cavity for obtaining the laser light from the light emitted by said active layer, said cavity being comprised of said active layer and an upper and a lower mirror sandwiching said active layer, said lower mirror being provided on said crystal substrate;
    wherein:
        said crystal substrate is a GaAs substrate;
        at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
        said low-refractivity semiconductor layers are each made of a material which has aluminum, indium and phosphorus as main component elements thereof.

2. A vertical cavity surface emitting laser according to claim 1, wherein said high-refractivity semiconductor layers are each made of a material which has gallium, indium, nitrogen and arsenic as main component elements thereof.

3. A vertical cavity surface emitting laser according to claim 2, wherein impurities for providing acceptors are doped into said semiconductor multilayer film.

4. A vertical cavity surface emitting laser according to claim 2, wherein said semiconductor multilayer film includes a plurality of pairs equal to or less than 30 each of which comprises the low-refractivity semiconductor layer and the high-refractivity semiconductor layer.

5. A vertical cavity surface emitting laser according to claim 1, wherein each of said high-refractivity semiconductor layers comprises a material except $Al_yGa_{1-y}As$ ($0 \leq y \leq 1$).

6. A vertical cavity surface emitting laser according to claim 1, wherein each of said low-refractivity semiconductor layers is an AlInP layer in which the content ratio of Al in the III-group elements is set at 50%.

7. A vertical cavity surface emitting laser emitting a laser light in a direction normal to the surface of a crystal substrate thereof, said laser having:
    an active layer above said crystal substrate, said active layer used for emitting a light; and
    a cavity for obtaining the laser light from the light emitted by said active layer, said cavity being comprised of said active layer and an upper and a lower mirror sandwiching said active layer, said lower mirror being provided on said crystal substrate,
    wherein:
        said crystal substrate is a GaAs substrate;
        at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
        said high-refractivity semiconductor layers are each made of a material which has gallium, indium, nitrogen and arsenic as main component elements thereof.

8. A vertical cavity surface emitting laser according to claim 7 wherein impurities for providing acceptors are doped into said semiconductor multilayer film.

9. A vertical cavity surface emitting laser emitting a laser light in a direction normal to the surface of a crystal substrate thereof, said laser having:
    an active layer above said crystal substrate, said active layer used for emitting a light; and
    a cavity for obtaining the laser light from said light emitted by said active layer, said cavity being comprised of said active layer and an upper and a lower mirror sandwiching said active layer, said lower mirror being provided on said crystal substrate,
    wherein:
        said crystal substrate is a GaAs substrate; and
        at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
        said active layer is made of a material which has gallium, indium, nitrogen and arsenic as main component elements thereof.

10. A vertical cavity surface emitting laser according to claim 9, wherein a wavelength of said laser light is longer than 0.85 µm and is in the wavelength range of the infrared light.

11. A vertical cavity surface emitting laser according to claim 10, wherein the wavelength of said laser light is in a 1.3 µm range.

12. A vertical cavity surface emitting laser according to claim 10, wherein the wavelength of said laser light is in a 1.55 µm range.

13. A vertical cavity surface emitting laser emitting a laser light in a direction normal to the surface of a crystal substrate thereof, said laser having:
    an active layer above said crystal substrate, said active layer used for emitting a light; and
    a cavity for obtaining the laser light from said light emitted by said active layer, said cavity being comprised of said active layer and an upper and a lower mirror sandwiching said active layer, said lower mirror being provided on said crystal substrate;
    wherein:
        said crystal substrate is a GaAs substrate;
        at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other;

said low-refractivity semiconductor layers are each made of a material which has aluminum, indium and phosphorus as main component elements thereof; and said active layer and said semiconductor multilayer film are provided in a semiconductor portion which is integrated with other semiconductor devices on said crystal substrate.

14. A vertical cavity surface emitting laser emitting a laser light in a direction normal to the surface of a crystal substrate thereof, said laser having:

an active layer above said crystal substrate, said active layer used for emitting a light; and a cavity for obtaining the laser light from said light emitted by said active layer, said cavity being comprised of said active layer and an upper and a lower mirror sandwiching said active layer, said lower mirror being provided on said crystal substrate;

wherein:
at least one of said upper and lower mirrors includes a semiconductor multilayer film comprising low-refractivity semiconductor layers and high-refractivity semiconductor layers, stacked alternately on each other;

said high-refractivity semiconductor layers are each made of a material which has gallium, indium, nitrogen and arsenic as main component elements thereof; and said active layer and said semiconductor multilayer film are provided in a semiconductor portion which is integrated with other semiconductor devices on said crystal substrate.

15. A vertical cavity surface emitting laser emitting a laser light in a direction normal to the surface of a crystal substrate thereof, said laser having:

an active layer above said crystal substrate, said active layer used for emitting a light; and a cavity for obtaining the laser light from said light emitted by said active layer, said cavity being comprised of said active layer and an upper and a lower mirror sandwiching said active layer, said lower mirror being provided on said crystal substrate;

wherein:
said crystal substrate is a GaAs substrate;
at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other;

said active layer is made of a material which has gallium, indium, nitrogen and arsenic as main component elements thereof; and said active layer and said semiconductor multilayer film are provided in a semiconductor portion which is integrated with other semiconductor devices on said crystal substrate.

16. An optical transmitter module comprising:

a laser emitting a laser light, said laser used as a light source;

a circuit for driving said laser; and an optical connector outputting the laser light;

wherein said laser is a vertical cavity surface emitting laser emitting the laser light in a direction normal to the surface of a crystal substrate thereof, said laser having:

an active layer above said crystal substrate, said active layer emitting a light; and a cavity for obtaining the laser light from said light emitted by said active layer, said cavity being comprised of said active layer and an upper and a lower mirror sandwiching said active layer, said lower mirror provided on said crystal substrate;

wherein:
said crystal substrate is a GaAs substrate;
at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and said low-refractivity semiconductor layers are each made of a material which has aluminum, indium and phosphorus as main component elements thereof.

17. An optical transmitter module according to claim 16, further comprising an optical fiber for sending the laser light emitted by said laser to the optical connector.

18. An optical transmitter module comprising:

a laser emitting a laser light, said laser used as a light source;

a circuit for driving said laser; and an optical connector outputting the laser light;

wherein said laser is a vertical cavity surface emitting laser emitting the laser light in a direction normal to the surface of a crystal substrate thereof, said laser having:

an active layer above said crystal substrate, said active layer emitting a light; and a cavity for obtaining the laser light from said light emitted by said active layer, said cavity being comprised of said active layer and an upper and a lower mirror sandwiching said active layer, said lower mirror provided on said crystal substrate;

wherein:
at least one of said upper and lower mirrors includes a semiconductor multilayer film comprising low-refractivity semiconductor layers and high-refractivity semiconductor layers, stacked alternately on each other; and said high-refractivity semiconductor layers are each made of a material which has gallium, indium, nitrogen and arsenic as main component elements thereof.

19. An optical transmitter module according to claim 18, further comprising an optical fiber for sending the laser light emitted by said laser to the optical connector.

20. An optical transmitter module comprising:

a laser emitting a laser light, said laser used as a light source;

a circuit for driving said laser; and an optical connector outputting the laser light;

wherein said laser is a vertical cavity surface emitting laser emitting the laser light in a direction normal to the surface of a crystal substrate thereof, said laser having:

an active layer above said crystal substrate, said active layer emitting a light; and a cavity for obtaining the laser light from said light emitted by said active layer, said cavity being comprised of said active layer and an upper and a lower mirror sandwiching said active layer, said lower mirror provided on said crystal substrate;

wherein:
said crystal substrate is a GaAs substrate; and
at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
said active layer is made of a material which has gallium, indium, nitrogen and arsenic as main component elements thereof.

21. An optical transmitter module according to claim 20, further comprising an optical fiber for sending the laser light emitted by said laser to the optical connector.

22. A parallel processing system comprising:
an optical transmitter module comprised of a laser which emits a laser light and is used as a light source, a circuit for driving said laser, and an optical connector outputting the laser light;
an optical receiver module including a photo-diode receiving the laser light; and
a computer performing parallel information processing,
wherein said laser is a vertical cavity surface emitting laser emitting the laser light in a direction normal to the surface of a crystal substrate thereof, said laser having:
an active layer above said crystal substrate, said active layer emitting a light; and
a cavity for obtaining the laser light from said light emitted by said active layer, said cavity being comprised of said active layer and an upper and a lower mirror sandwiching said active layer, said lower mirror provided on said crystal substrate;
wherein:
said crystal substrate is a GaAs substrate;
at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
said low-refractivity semiconductor layers are each made of a material which has aluminum, indium and phosphorus as main component elements thereof.

23. A parallel processing system according to claim 22, wherein said optical transmitter module has an optical fiber for sending the laser light emitted by said laser to the optical connector, said system further comprising an optical fiber for sending data of the computer.

24. A parallel processing system comprising:
an optical transmitter module comprised of a laser which emits a laser light and is used as a light source, a circuit for driving said laser, and an optical connector outputting the laser light;
an optical receiver module including a photo-diode receiving the laser light; and
a computer performing parallel information processing;
wherein said laser is a vertical cavity surface emitting laser emitting the laser light in a direction normal to the surface of a crystal substrate thereof, said laser having:
an active layer above said crystal substrate, said active layer emitting a light; and
a cavity for obtaining the laser light from said light emitted by said active layer, said cavity being comprised of said active layer and an upper and a lower mirror sandwiching said active layer, said lower mirror provided on said crystal substrate;
wherein:
at least one of said upper and lower mirrors includes a semiconductor multilayer film comprising low-refractivity semiconductor layers and high-refractivity semiconductor layers, stacked alternately on each other; and
said high-refractivity semiconductor layers are each made of a material which has gallium, indium, nitrogen and arsenic as a main element thereof.

25. A parallel processing system according to claim 24, wherein said optical transmitter module has an optical fiber for sending the laser light emitted by said laser to the optical connector, said system further comprising an optical fiber for sending data of the computer.

26. A parallel processing system comprising:
an optical transmitter module comprised of a laser which emits a laser light and is used as a light source, a circuit for driving said laser, and an optical connector outputting the laser light;
an optical receiver module including a photo-diode receiving the laser light; and
a computer performing parallel information processing;
wherein said laser is a vertical cavity surface emitting laser emitting the laser light in a direction normal to the surface of a crystal substrate thereof, said laser having:
an active layer above said crystal substrate, said active layer used for emitting a light; and
a cavity for obtaining the laser light from said light emitted by said active layer, said cavity being comprised of said active layer and an upper and a lower mirror sandwiching said active layer, said lower mirror provided on said crystal substrate;
wherein:
said crystal substrate is a GaAs substrate;
at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
said active layer is made of a material which has gallium, indium, nitrogen and arsenic as main component elements thereof.

27. A parallel processing system according to claim 26, wherein said optical transmitter module has an optical fiber for sending the laser light emitted by said laser to the optical connector, said system further comprising an optical fiber for sending data of the computer.

28. An optical-fiber communication system comprising:
a laser emitting a laser light, said laser used as a light source;
a circuit for driving said laser;
an optical fiber for transmitting the laser light emitted by said laser; and
a photo detector receiving the laser light;
wherein said laser is a vertical cavity surface emitting laser emitting the laser light in a direction normal to the surface of a crystal substrate thereof, said laser having:
an active layer above said crystal substrate, said active layer used for emitting a light; and
a cavity for obtaining the laser light from said light emitted by said active layer, said cavity being comprised of said active layer and an upper and a lower mirror sandwiching said active layer, said lower mirror provided on said crystal substrate;

wherein:
said crystal substrate is a GaAs substrate;
at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
said low-refractivity semiconductor layers are each made of a material which has aluminum, indium and phosphorus as main component elements thereof.

29. An optical-fiber communication system comprising:
a laser emitting a laser light, said laser used as a light source;
a circuit for driving said laser;
an optical fiber for transmitting the laser light emitted by said laser; and
a photo detector receiving the laser light;
wherein said laser is a vertical cavity surface emitting laser emitting the laser light in a direction normal to the surface of a crystal substrate thereof, said laser having:
an active layer above said crystal substrate, said active layer used for emitting a light; and
a cavity for obtaining the laser light from said light emitted by said active layer, said cavity being comprised of said active layer and an upper and a lower mirror sandwiching said active layer, said lower mirror provided on said crystal substrate;
wherein:
at least one of said upper and lower mirrors includes a semiconductor multilayer film comprising low-refractivity semiconductor layers and high-refractivity semiconductor layers, stacked alternately on each other; and
said high-refractivity semiconductor layers are each made of a material which has gallium, indium, nitrogen and arsenic as main component elements thereof.

30. An optical-fiber communication system comprising:
a laser emitting a laser light, said laser used as a light source;
a circuit for driving said laser;
an optical fiber for transmitting the laser light emitted by said laser; and
a photo detector receiving the laser light;
wherein said laser is a vertical cavity surface emitting laser emitting the laser light in a direction normal to the surface of a crystal substrate thereof, said laser having:
an active layer above said crystal substrate, said active layer emitting a light; and
a cavity for obtaining the laser light from said light emitted by said active layer, said cavity being comprised of said active layer and an upper and a lower mirror sandwiching said active layer, said lower mirror provided on said crystal substrate;
wherein:
said crystal substrate is a GaAs substrate;
at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
said active layer is made of a material which has gallium, indium, nitrogen and arsenic as main component elements thereof.

31. An optical transmitter-receiver module comprising:
a board on which a laser used as a light source, a circuit driving said laser and a photo detector receiving a laser light emitted by said laser are implemented;
an optical fiber coupled with said laser; and
an optical fiber coupled with the photo detector;
wherein said laser is a vertical cavity surface emitting laser emitting the laser light in a direction normal to the surface of a crystal substrate thereof, said laser having:
an active layer above said crystal substrate, said active layer used for emitting a light; and
a cavity for obtaining the laser light from said light emitted by said active layer, said cavity being comprised of said active layer and an upper and a lower mirror sandwiching said active layer, said lower mirror provided on said crystal substrate;
wherein:
said crystal substrate is a GaAs substrate;
at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and
said low-refractivity semiconductor layers are each made of a material which has aluminum, indium and phosphorus as main component elements thereof.

32. An optical transmitter-receiver module comprising:
a board on which a laser used as a light source, a circuit driving said laser and a photo detector receiving a laser light emitted by said laser are implemented;
an optical fiber coupled with said laser; and
an optical fiber coupled with the photo detector;
wherein said laser is a vertical cavity surface emitting laser emitting the laser light in a direction normal to the surface of a crystal substrate thereof, said laser having:
an active layer above said crystal substrate, said active layer used for emitting a light; and
a cavity for obtaining the laser light from said light emitted by said active layer, said cavity being comprised of said active layer and an upper and a lower mirror sandwiching said active layer, said lower mirror provided on said crystal substrate;
wherein:
at least one of said upper and lower mirrors includes a semiconductor multilayer film comprising low-refractivity semiconductor layers and high-refractivity semiconductor layers, stacked alternately on each other; and
said high-refractivity semiconductor layers are each made of a material which has gallium, indium, nitrogen and arsenic as main component elements thereof.

33. An optical transmitter-receiver module comprising:
a board on which a laser used as a light source, a circuit driving said laser and a photo detector receiving a laser light emitted by said laser are implemented;
an optical fiber coupled with said laser; and
an optical fiber coupled with the photo detector;
wherein said laser is a vertical cavity surface emitting laser emitting the laser light in a direction normal to the surface of a crystal substrate thereof, said laser having:
an active layer above said crystal substrate, said active layer emitting a light; and a cavity for obtaining the laser light from said light emitted by said active layer, said cavity being comprised of said active layer and an upper and a lower mirror sandwiching said active layer, said lower mirror provided on said crystal substrate;

wherein:

said crystal substrate is a GaAs substrate;

at least one of said upper and lower mirrors includes a semiconductor multilayer film comprising low-refractivity semiconductor layers lattice-matching said GaAs substrate and high-refractivity semiconductor layers also lattice-matching said GaAs substrate, stacked alternately on each other; and said active layer is made of a material which has gallium, indium, nitrogen and arsenic as main component elements thereof.

34. A vertical cavity surface emitting laser emitting a laser light in a direction normal to the surface of a crystal substrate thereof, said laser having:

an active layer above said crystal substrate, said active layer used for emitting a light; and a cavity for obtaining the laser light from said light emitted by said active layer, said cavity being comprised of said active layer and an upper and a lower mirror sandwiching said active layer, said lower mirror provided on said crystal substrate;

wherein:

at least one of said upper and lower mirrors includes a semiconductor multilayer film comprising low-refractivity semiconductor layers and high-refractivity semiconductor layers, stacked alternately on each other; and said high-refractivity semiconductor layers are each made of a material which has gallium, indium, nitrogen and arsenic as main component elements thereof.

35. A vertical cavity surface emitting laser according to claim 34, wherein impurities for providing acceptors are doped into said semiconductor multilayer film.

* * * * *